(12) United States Patent
Coldren et al.

(10) Patent No.: US 6,954,476 B2
(45) Date of Patent: Oct. 11, 2005

(54) SAMPLED GRATING DISTRIBUTED BRAGG REFLECTOR LASER CONTROLLER

(75) Inventors: Larry A. Coldren, Santa Barbara, CA (US); Paul F. Crowder, Santa Barbara, CA (US)

(73) Assignee: Agility Communications, Inc., Santa Barbara, CA (US)

( * ) Notice: Subject to any disclaimer, the term of this patent is extended or adjusted under 35 U.S.C. 154(b) by 36 days.

(21) Appl. No.: 10/476,770
(22) PCT Filed: May 15, 2002
(86) PCT No.: PCT/US02/15287
  § 371 (c)(1),
  (2), (4) Date: Nov. 5, 2003
(87) PCT Pub. No.: WO02/093695
  PCT Pub. Date: Nov. 21, 2002

(65) Prior Publication Data
US 2004/0136423 A1 Jul. 15, 2004

Related U.S. Application Data
(60) Provisional application No. 60/291,375, filed on May 15, 2001, and provisional application No. 60/291,481, filed on May 15, 2001.

(51) Int. Cl.[7] .............................................. H01S 3/00
(52) U.S. Cl. ................................ 372/38.02; 372/38.07; 372/29.015; 372/29.016
(58) Field of Search ............................ 372/50, 26, 32, 372/38.01, 38.02, 38.07, 29.015

(56) References Cited

U.S. PATENT DOCUMENTS

| 4,622,672 A | 11/1986 | Coldren |
| 4,728,188 A | 3/1988 | Kitagawa |
| 4,896,325 A | 1/1990 | Coldren |
| 5,132,897 A * | 7/1992 | Allenberg .................. 700/29 |
| 5,155,736 A | 10/1992 | Ono et al. |

(Continued)

FOREIGN PATENT DOCUMENTS

| EP | 0 774 684 A2 | 5/1997 |
| EP | 0 926 789 A2 | 6/1999 |
| WO | WO 99/40654 | 8/1999 |

OTHER PUBLICATIONS

Sarlet et al. (Wavelength and Mode Stabilization of Widely Tunable SG–DBR and SSG–DBR Lasers Article in IEEE Photonics Technology Letters, vol. 11, No. 11. Nov. 1999).*
Ishii, Hiroyuki et al., "Mode Stablization Method for Superstructure–Grating DBR Lasers", Journal of Lightwave Technology, IEEE, vol. 16, No. 3, Mar. 1, 1998, pp. 433–442, XP000751395.
Sadet, G. et al., "Wavelength and Mode Stablization of Widely Tunable SG–DBR and SSG–DBR Lasers", IEEE, vol. 11, No. 11, Nov. 1999, pp. 1351–1353, XP000893767.
Jayaraman, V. et al., "Theory, Design, and Performance of Extended Tuning Range Semiconductor Lasers with Sampled Gratings," 1993, IEEE, Journal of Quantum Electronics, 29(6):92–102.

*Primary Examiner*—Minsun Oh Harvey
*Assistant Examiner*—Dung (Michael) T. Nguyen
(74) *Attorney, Agent, or Firm*—Gates & Cooper LLP

(57) ABSTRACT

A controller for use with sampled grating distributed Bragg reflector (SGDBR) lasers is presented. An exemplary controller includes a table of settings representing a control surface, each setting corresponding to a separate operating point of the SGDBR laser, a first mirror current controller and a second mirror current controller. The first mirror controller and the second mirror current controller respectively control a first mirror current and a second mirror current about an estimated extremum point of the control surface to substantially maintain alignment between each of a first mirror and a second mirror, and an associated cavity mode. The first mirror current and the second mirror current can be locked at a substantially fixed distance from the extremum of the control surface.

18 Claims, 10 Drawing Sheets

U.S. PATENT DOCUMENTS

| | | |
|---|---|---|
| 5,255,276 A | 10/1993 | Tabuchi |
| 5,325,392 A | 6/1994 | Tohmori et al. |
| 5,392,311 A | 2/1995 | Makuta |
| 5,579,328 A | 11/1996 | Habel et al. |
| 5,715,271 A | 2/1998 | Huang et al. |
| 5,757,832 A | 5/1998 | Uchida |
| 5,838,714 A | 11/1998 | Delorme |
| 5,936,994 A | 8/1999 | Hong et al. |
| 5,966,159 A | 10/1999 | Ogasawara |
| 5,978,393 A | 11/1999 | Feldman |
| 6,052,400 A | 4/2000 | Nanbu et al. |
| 6,185,233 B1 | 2/2001 | Moothart |
| 6,212,210 B1 | 4/2001 | Serizawa |
| RE37,524 E | 1/2002 | Taguchi |
| 6,345,135 B1 | 2/2002 | Reid et al. |
| 6,349,106 B1 * | 2/2002 | Coldren .................. 372/50 |
| 6,359,918 B1 | 3/2002 | Bielas |
| 6,366,592 B1 | 4/2002 | Flanders |
| 6,519,062 B1 | 2/2003 | Yoo |

* cited by examiner

SAMPLED GRATING DISTRIBUTED BRAGG REFLECTOR LASER CONTROLLER

CROSS-REFERENCE TO RELATED APPLICATIONS

This application claims the benefit under 35 U.S.C. §119 (e) of the following commonly-assigned U.S. patent application which are incorporated by reference herein:

Provisional Application Ser. No. 60/291,375, filed May 15, 2001, now abandoned and by Larry A. Coldren and Paul F. Crowder, entitled "SGDBR LASER CONTROLLER," and Provisional Application Ser. No.60/291,481, filed May 15, 2001, now abandoned and by Larry A. Coldren and Michael C. Larson, entitled "CONTROLLER CALIBRATION FOR SMALL FORM FACTOR SGDBR LASER."

This application is a continuation-in-part patent application of the following co-pending and commonly-assigned U.S. patent applications which are all incorporated by reference herein:

Utility Application Ser. No. 09/895,848, filed Jun. 29, 2001, by Paul F. Crowder, entitled "OPEN LOOP CONTROL OP SGDBR LASERS," now U.S. Pat. No. 6,788,719,issued Sep. 7, 2004, which claims the benefit under 35 U.S.C. §119(e) of Provisional Application Ser. No. 60/215,739, filed Jun. 29, 2000, by Paul F. Crowder, entitled "OPEN LOOP CONTROL OF SGDBX LASERS."

Utility Application Ser. No. 09/895,598, filed Jun. 29, 2001, by Paul F. Crowder, entitled "POWER AND WAVELENGTH CONTROL OF SAMPLED GRATING DISTRIBUTED BRAGG REFLECTOR LASERS," now U.S. Pat. No. 6,690,693, issued Feb. 10, 2004, which claims the benefit under 35 U.S.C. §119(e) of Provisional Application Ser. No. 60/215,739, filed Jun. 29, 2000, by Paul F. Crowder, entitled "POWER AND WAVELENGTH CONTROL OF SGDBR LASERS," and Utility Application Ser. No. 09/895,303, filed on Jun. 29, 2001, by Gregory A. Fish and Larry A. Coldren, entitled "GAIN VOLTAGE CONTROL OF SAMPLED GRATING DISTRIBUTED BRAGG REFLECTOR LASERS," now abandoned, which claims the benefit under 35 U.S.C. §119 (e) of Provisional Application Ser. No. 60/215,742, filed Jun. 29, 2000, by Paul F. Crowder and Larry A. Coldren, entitled "GAIN VOLTAGE CONTROL OF SGDBR LASERS."

BACKGROUND OF THE INVENTION

1. Field of the Invention.

The present invention relates generally to widely-tunable semiconductor lasers. More particularly, the present invention relates to edge-emitting diode lasers. And even more particularly to sampled-grating distributed Bragg reflector (SGDBR) lasers and the control thereof. Most particularly, the present invention relates to the control modes of a SGDBR laser controller. The controller controls the SGDBR laser currents and temperature to therefore control laser output power and wavelength.

2. Description of the Related Art

Diode lasers are being used in such applications as optical communications, sensors and computer systems. In such applications, it is very useful to employ lasers that can be easily adjusted to output frequencies across a wide wavelength range. A diode laser which can be operated at selectably variable frequencies covering a wide wavelength range, i.e. a widely tunable laser, is an invaluable tool. The number of separate channels that can utilize a given wavelength range is exceedingly limited without such a laser. Accordingly, the number of individual communications paths that can exist simultaneously in a system employing such range-limited lasers is similarly very limited. Thus, while diode lasers have provided solutions to many problems in communications, sensors and computer system designs, they have not fulfilled their potential based on the available bandwidth afforded by light-based systems. It is important that the number of channels be increased in order for optical systems to be realized for many future applications.

For a variety of applications, it is necessary to have tunable single-frequency diode lasers which can select any of a wide range of wavelengths. Such applications include sources and local oscillators in coherent lightwave communications systems, sources for other multi-channel lightwave communication systems, and sources for use in frequency modulated sensor systems. Continuous tunability is usually needed over some range of wavelengths. Continuous tuning is important for wavelength locking or stabilization with respect to some other reference, and it is desirable in certain frequency shift keying modulation schemes.

In addition, widely tunable semiconductor lasers, such as the sampled-grating distributed-Bragg-reflector (SGDBR) laser, the grating-coupled sampled-reflector (GCSR) laser, and vertical-cavity lasers with micro-mechanical moveable mirrors (VCSEL-MEMs) generally must compromise their output power in order to achieve a large tuning range. The basic function and structure of SGDBR lasers is detailed in U.S. Pat. No. 4,896,325, issued Jan. 23, 1990, to Larry A. Coldren, and entitled "MULTI-SECTION TUNABLE LASER WITH DIFFERING MULTI-ELEMENT MIRRORS", which patent is incorporated by reference herein. Designs that can provide over 40 nm of tuning range have not been able to provide much more than a couple of milliwatts of power out at the extrema of their tuning spectrum. However, current and future optical fiber communication systems as well as spectroscopic applications require output powers in excess of 10 mW over the full tuning band. Current International Telecommunication Union (ITU) bands are about 40 nm wide near 1.55 $\mu$m, and it is desired to have a single component that can cover at least this optical bandwidth. Systems that are to operate at higher bit rates will require more than 20 mW over the full ITU bands. Such powers are available from distributed feedback DFB lasers, but these can only be tuned by a couple of nanometers by adjusting their temperature. Thus, it is very desirable to have a source with both wide tuning range (>40 nm) and high power (>20 mW) without a significant increase in fabrication complexity over existing widely tunable designs. Furthermore, in addition to control of the output wavelength, control of the optical power output for a tunable laser is an equally important endeavor as optical power determines the potential range for the laser.

Fundamentally, maximizing the output power, while stabilizing the output wavelength and the maximizing the side mode suppression ratio are very desirable objectives in the control of SGDBR lasers. Thus, there is a need in the art for controllers which maximize the power output and stabilize the wavelength, particularly as the laser ages. The present invention meets the foregoing objectives through a novel controller.

SUMMARY OF THE INVENTION

The present invention involves the calibration of a laser and an open loop controller of the frequency (or alternatively "wavelength") output and power output of such a laser, which is preferably a Sampled Grating Distributed Bragg Reflector (SGDBR) semiconductor laser. The SGDBR laser generally includes at least four discrete sections: a gain section, a phase section, a first (or alternatively "front") mirror section and a second (or alternatively "rear") mirror section. Additionally, a semiconductor optical amplifier ("SOA") section may be included as well as other discrete sections. The controller of such SGDBR devices provides stable SGDBR laser optical power and wavelength output by varying the control currents that are applied to each of the aforementioned sections.

Calibration of the SGDBR laser and the controller establishes a table of current or voltage settings to control the laser's optical output power and the output wavelength. Once the optical power and output wavelength are selected, the controller of the present invention selects a set of operating currents or voltages from the table corresponding to the selected output power and output wavelength. Further, the controller regulates the temperature of the SGDBR laser to a fixed, pre-selected value.

A SGDBR laser generally includes a laser diode, a laser diode module ("LDM"), and a control hardware package; all of which are housed in what shall be referred to herein as a tunable laser assembly ("TLA"). The laser diode is housed within the laser diode module, which may be a butterfly package or some other small package well known to those skilled in the art for having mounted thereto and therewithin a laser diode.

The LDM is housed within and is a subcomponent of the TLA. Additionally, the TLA houses the controller, which comprises hardware and firmware loaded thereupon. The TLA also comprises connectors extending between the controller and the LDM providing for communication therebetween.

By properly choosing the operating currents, the current sources that deliver the currents to the SGDBR laser diode, and properly regulating the temperature of the SGDBR laser, the controller of the present invention provides great stability of the optical output wavelength and power over the operating lifetime, as well as providing greater stability over a wider range of ambient environmental conditions.

An exemplary controller embodiment of the invention includes a table of settings representing a control surface, each setting corresponding to a separate operating point of the SGDBR laser, a first mirror current controller and a second mirror current controller. The first mirror controller and the second mirror current controller respectively control a first mirror current and a second mirror current about an estimated extremum point of the control surface to substantially maintain alignment between each of a first mirror and a second mirror, and an associated cavity mode. The first mirror current and the second mirror current can be locked at a substantially fixed distance from the extremum of the control surface.

BRIEF DESCRIPTION OF THE DRAWINGS

Referring now to the drawings in which like reference numbers represent corresponding parts throughout.

DETAILED DESCRIPTION OF THE PREFERRED EMBODIMENTS

In the following description, reference is made to the accompanying drawings which form a part hereof, and which is shown, by way of illustration, an embodiment of the present invention. It is understood that other embodiments may be utilized and structural changes may be made without departing from the scope of the present invention.

1.0 Overview

Figure 1:
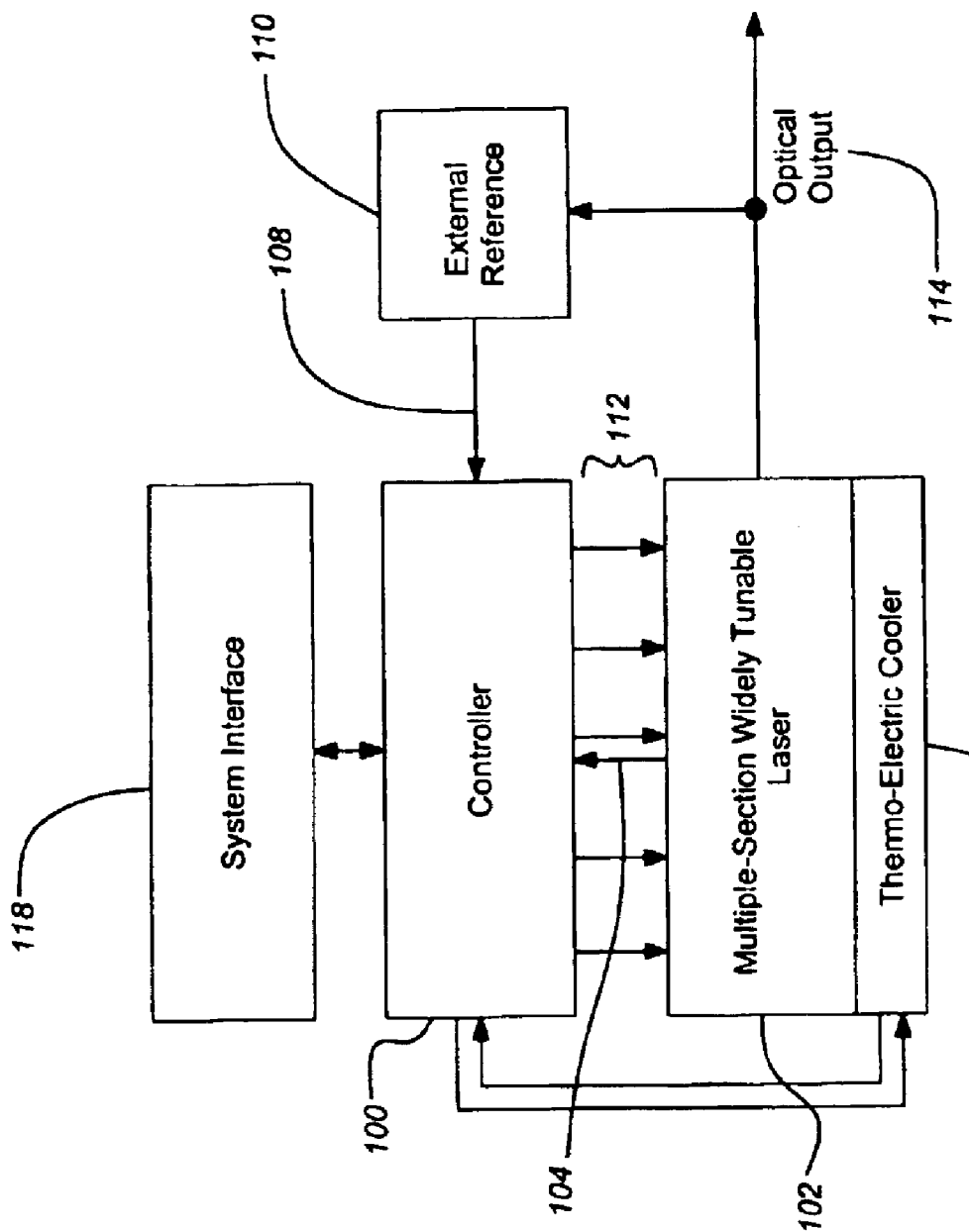
FIG. 1 is a laser system block diagram.

FIG. 1 is a laser system block diagram. The present invention is directed to the calibration of an SGDBR laser controller 100 (hereinafter referred to as a "controller"). The controller 100 monitors a multi-section, widely tunable SGDBR laser's 102 (hereinafter referred to as a "laser") gain section voltage 104, temperature 106, and wavelength locker 108 signals. The wavelength locker signal 108 is produced from an external reference 110 (a wavelength locker, alternatively referred to as an "FP etalon"). The laser 102 generally has a first or front mirror section (sometimes referred to herein as "FM"), a second or back mirror section (sometimes referred to herein as "BM"), a gain section for light generation (sometimes referred to herein as "Gn"), and a phase section provided to tune the output wavelength of the laser (sometimes referred to herein as "Ph") each controlled with current inputs 112. Additionally, other sections may be incorporated onto the laser diode including, but not limited to a semiconductor optical amplifier, a modulator, or some other well-known component that may be fabricated on the same substrate as the laser.

As shown in FIG. 1, the controller 100 adjusts each section's current (with inputs 102) and the laser's temperature to maintain a fixed optical output 114 power and wavelength. The laser's temperature is adjusted with a thermoelectric cooler 116 (or "TEC"), or some other well known cooling mechanism or method. The laser 102 is controlled to generate optical output 114 at a substantially continuous power-level.

The controller 100 interfaces to a host (not shown) over a system interface 118, which is typically a serial or parallel interface. The host commands the operation of the controller 100 and may be a personal computer, workstation, or some other well-known device capable of sending commands to the controller 100 through the system interface 118.

The controller 100 regulates the laser's optical output 114 power and wavelength. The controller 100 operates in one of the following control modes, each of which shall be described in more detail hereinbelow:

A. Open loop control using fixed operating points,
B. Power and wavelength control using open loop control's fixed operating points as the initial operating points and regulating the optical power and wavelength to a reference,
C. Gain voltage control using open loop control's fixed operating points as the initial operating points and regulating the laser mirror alignment with the cavity mode, and D. Power, wavelength, and gain voltage control using open loop control's fixed operating points as the initial operating points.

1.1 Open Loop Control

Figure 2:
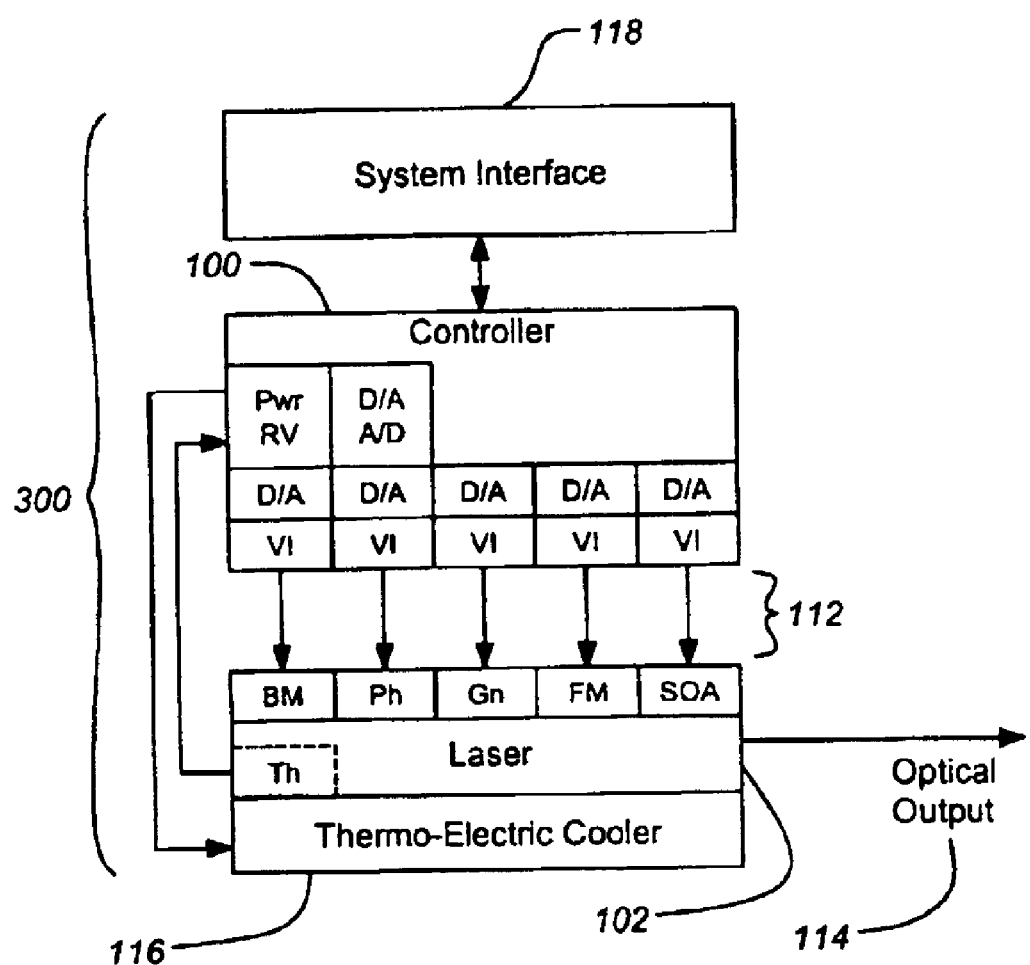
FIG. 2 depicts a block diagram of an open loop control in accordance with the present invention.

As shown in FIG. 2, in an open loop control mode, the controller 100 sets the laser optical output 114 power and wavelength by setting the laser section (BM, Ph, Gn, FM and SOA) currents 112 from values in a look up table. It regulates the laser's temperature to a fixed value by sending control code to the TEC 116. The look-up table values are generated by a calibration routine. The values are fixed over the lifetime of the laser 100. The choice of the operating currents 112, the current sources, and the temperature regulator guarantees maximum stability of the optical output 114 wavelength and power over the laser operating lifetime and ambient environmental conditions.

In some embodiments of the invention, the controller can be implemented with "open loop" controller hardware as described above, however feedback is provided (e.g. to control the mirror alignment). Thus, the controller operates in a closed loop with respect one or more of the laser control parameters (e.g., mirrors, gain, or phase). Control loops for power and/or wavelength control can also be applied. In addition, temperature regulation also can be operated under a closed loop control. As such, there is often no clear distinction between open and closed loop operation of the controller.

1.2 Operating Points

The laser operating points are typically determined by one of three calibration routines, incremental, mirror reflectivity peak, or a two-dimensional mirror scan.

2.0 Incremental Calibration

Incremental calibration steps and locks the laser to each International Telecommunications Union (ITU) wavelength channel using a calibrated wavelength locker as a reference. It steps to the next channel by adjusting the phase current and locking the mirrors to the cavity mode with gain voltage control, which shall be discussed in further detail hereinbelow. Once at the channel, the laser wavelength is locked to the channel by adjusting the phase current using wavelength control and the laser power to a predetermined set point by adjusting the gain current with power control.

The process of incremental calibration starts with the first and second mirrors aligned at mirror reflectivity peak 0 and then steps to locate the next lower channel. At each cavity mode, the phase current is reset to its initial value and the search is continued. At the end of each mirror tuning range, the mirror currents are reset to the next mirror reflectivity peak. Once the wavelength wraps around, the process is repeated at mirror reflectivity peak 0 by searching for the next upper channel. The process is as follows:

For each wavelength direction about mirror reflectivity peak 0
  Until (wavelength wraps),
    Set gain current at nominal operational current;
    Set mirrors at next reflectivity peak;
    Until (end of mirror tuning range),
      Set phase current at minimum operational current; and
      Lock mirrors to cavity mode;
      Until (passes cavity mode),
        Lock power and wavelength at channel and align mirrors;
        Record channel and currents; and
        Step to next channel with mirrors locked to phase.

3.0 Mirror Reflectivity Peak Calibration

Mirror reflectivity peak calibration determines the mirror reflectivity peaks, generates the mirror tuning efficiency curves, and uses the curves to set the mirror currents for each channel. The process is as follows:

Until (wavelength crosses mirror reflectivity peak 0),
  Sweep mirror with cavity mode aligned to mirror;
  Locate the gain voltage minima, which is the corresponding mirror reflectivity peak; and
  Record the currents;
Generate mirror tuning efficiency curve from reflectivity peaks;
Until (step through all channels),
  Set mirrors to channel using mirror tuning efficiency curve;
  Align phase section to the mirrors;
  Lock wavelength to channel using wavelength control;
  Lock power to set point using power control;
  Record the channel and current.

4.0 Two-dimensional Mirror Scan Calibration

A two-dimensional mirror scan calibration of the present invention (as may be employed for a small form factor TLA) determines the laser currents for operation at each ITU channel and the power and wavelength and mirror control surfaces and operating points at each ITU channel The calibration procedure for the small form factor TLA and laser involves the following steps:

A. Conduct two-dimensional mirror current scan with power leveling and wavelength locking
  B. Channel operating region detection
  C. Fixup of operating current values
  D. Two-dimensional control surface characterization; and
  E. Generate lookup table

5.0 Current Sources

Figure 3:
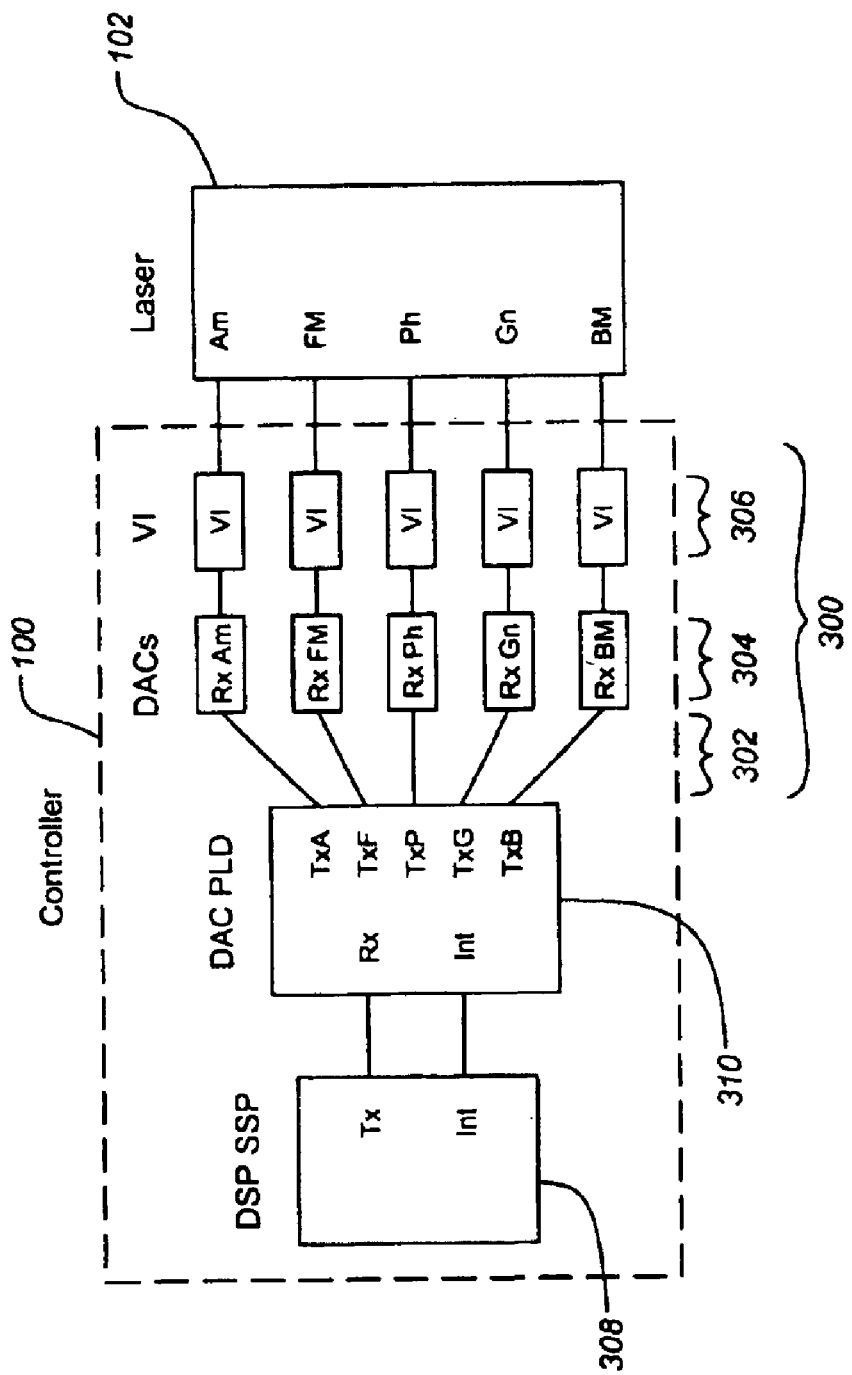
FIG. 3 is a block diagram of the current sources in accordance with the present invention.

As shown in FIG. 3, the controller 100 includes current sources 300 which drive each of the laser's phase, mirror, amplifier, and gain sections. The current sources 300 are comprised of a voltage reference 302, individual 16-bit digital-to-analog converters 304 (DACs), and voltage-to-current (VI) converter 306. The DACs 304 connect to a digital signal processor (DSP) synchronous serial port (SSP) 308 through a programmable-logic device 310 (PLD). The PLD 310 provides a logic interface between the DSP SSP 308 and the DACs 300. Each VI converter 306 translates the corresponding DAC 304 voltage output to a proportional current that drives a corresponding laser section.

5.1 Voltage to Current Converter

Figure 4:
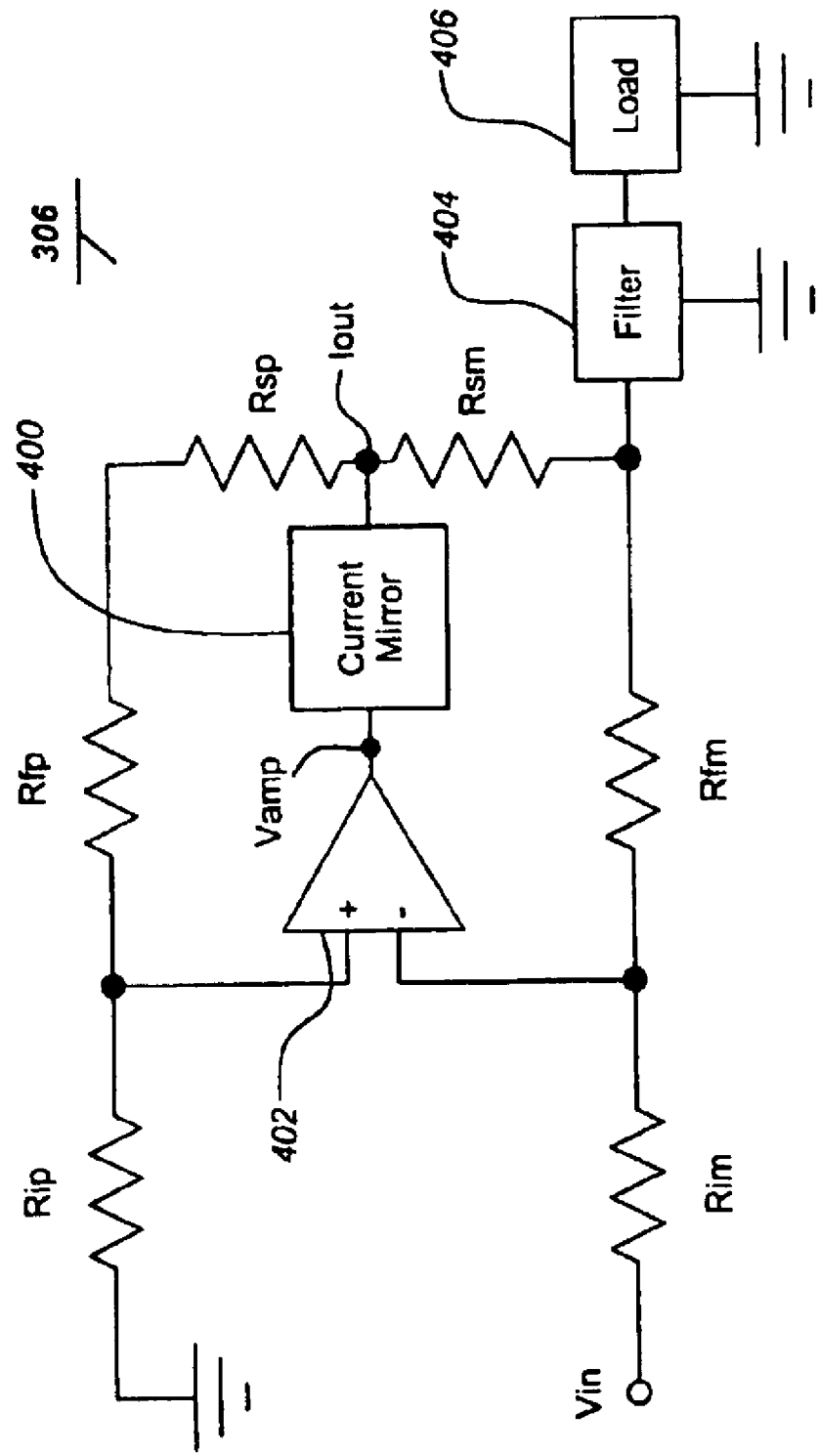
FIG. 4 is a block circuit diagram of a modified Howland current source circuit in accordance with the present invention.
Figure 5:
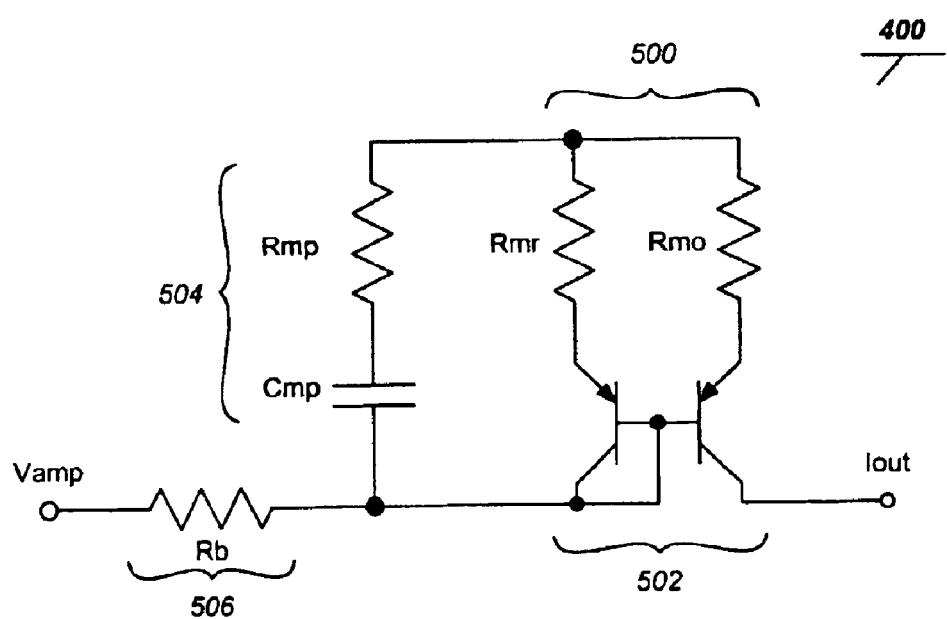
FIG. 5 is a block diagram of a current mirror circuit in accordance with the present invention.

As depicted in FIG. 4, a modified Howland current source (MHCS) can be used as the voltage-to-current converter 306. A current mirror 400, such as that shown in FIG. 5, is preferably added to the output stage of the amplifier 402 to increase the drive current beyond that of the amplifier 402 alone. A filter stage 404 was added at the load 406 to reduce noise. The current mirror 400 inverts the output of the amplifier 402, which requires the source, $V_{in}$, at the inverting node of the amplifier 402.

The current mirror 400 operates at a fixed gain that is determined, primarily, by the ratio of the resistors 500 in the emitter leads of the transistor 502. A resistor-capacitor (RC) compensation network 504 is added to insure stability of the amplifier 402 and current mirror 400. The gain of the current is variable up to a maximum ratio. The maximum ratio is determined by the additional drift introduced by heating of the transistor 502 and sense resistor 506 and the maximum thermal loss that can be sustained by the transistor 502 and sense resistor 506. If additional gain is required, an additional $Q_{mo}$ & $R_{mo}$ section can be added to the mirror 400.

6.0 Power and Wavelength Control

Figure 6:
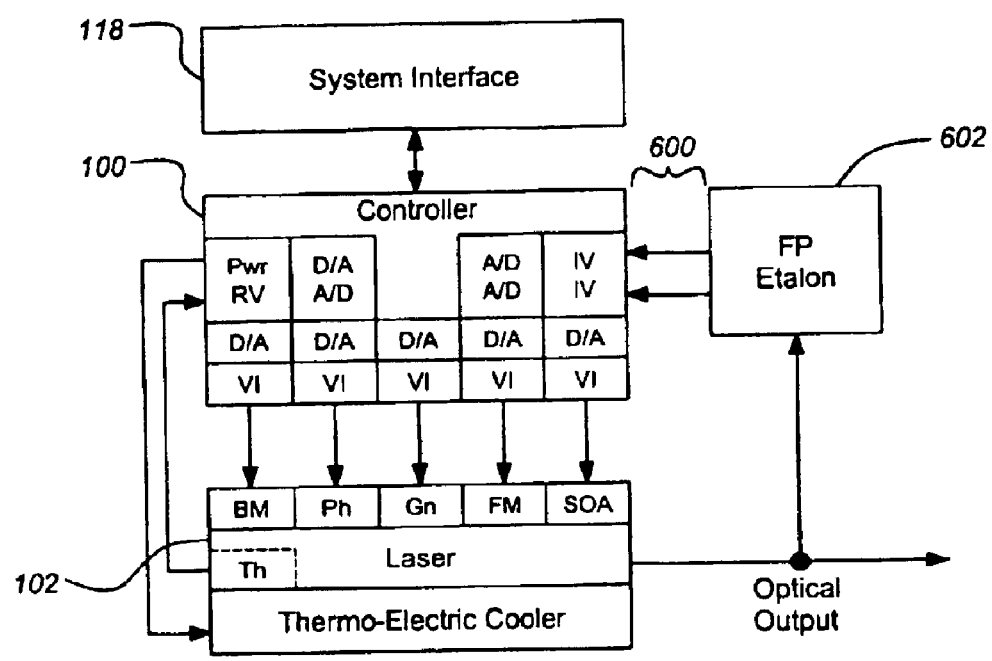
FIG. 6 is a block diagram of a power and wavelength control method in accordance with the present invention.

As shown in FIG. 6, the power and wavelength controller 100 uses open loop control and feedback 600 from an external wavelength locker 602 (FP etalon) reference to lock the laser optical output power and wavelength to the reference. Power and wavelength control compensates for drift in the controller current sources 300 and the laser 102 operating points over time and temperature. The power and wavelength controls may operate independently or interdependently.

6.1 Independent Power and Wavelength Control

The least complex control algorithm is where the controls operate independently. Each control algorithm induces changes in one current or temperature independent of the other. The control algorithms are classical proportional, integral control routines. For example, the following algorithm can be applied:

Optical power is adjusted by
  Gain current ($I_{gn}$), or
  Current to a SOA (if integrated into the laser).
Optical wavelength is adjusted by
  Phase current ($I_{ph}$), or
  Submount temperature
Mirror currents are left fixed.

In most cases, gain current is used on four-section devices, and amplifier current is used on five-section devices. Current to the semiconductor optical amplifier (SOA) instead of current to the gain section can be used in all cases concerning power control or power leveling when an amplifier section is present on the laser chip. Gain voltage control (See section 7) may be used in either case. However, when gain voltage control is combined with gain current-based power control, power control must be interrupted (i.e. gain current held constant) during acquisition of a gain voltage control surface.

6.2 Interdependent Power and Wavelength Control

The independent control algorithm is slower and in its response to changes in the optical power output and optical wavelength. The mirrors and cavity mode become misaligned as the control algorithm adjusts the gain and phase currents from their predefined values. The quality of the optical output may be reduced as a result of decreased side mode suppression ratio. Additionally, the probability of a mode hop (wavelength shift) is increased as the mirrors and cavity mode become misaligned.

The interdependent control algorithm induces primary changes in one current or temperature and corrects for secondary changes in the other currents with an adaptive filter or estimator. This compensates for wavelength shifts or power changes and mirror misalignment induced when the control adjusts its primary variable. Using an interdependent power and wavelength control algorithm as follows:

Power is adjusted by the gain current ($I_{gn}$),
  Wavelength is stabilized by adjusting the phase current ($I_{ph}$) by an adaptive filter; and
  Mirror currents are realigned by a fixed estimator,
Wavelength is adjusted by the phase current ($I_{ph}$) or the carrier temperature
  Power is stabilized by adjusting the gain current ($I_{gn}$) by an adaptive filter; and
  Mirror currents are realigned by a fixed estimator.

The interdependent controls provide more robust, stable, and faster convergence of the power and wavelength to its reference value.

7.0 Gain Voltage Control

Gain voltage control uses feedback from the laser gain section voltage to keep the mirrors aligned with the cavity mode. It aligns the mirrors by minimizing the laser gain section voltage. The laser gain section voltage minimum is where the cavity loss is a minimum, roughly corresponding to maximum optical power output, wavelength stability, and side mode suppression ratio. More specifically, the gain voltage minimum corresponds to the minimum loss condition when parasitic electrical effects are accounted for, but gain spectrum effects offset the minimum from mode center in a characteristic fashion. Additional output power may be achieved using certain techniques, such as by misaligning the front mirror, however, in such a case, other characteristics may suffer, such as the side mode suppression ratio.

Gain voltage control can be implemented in the DSP using a numerical minima search or a least mean squares (LMS) quadratic estimator. Alternately, gain voltage control can be implemented in analog circuitry using a phase locker circuit (PL).

7.1 DSP Gain Voltage Control

Figure 7:
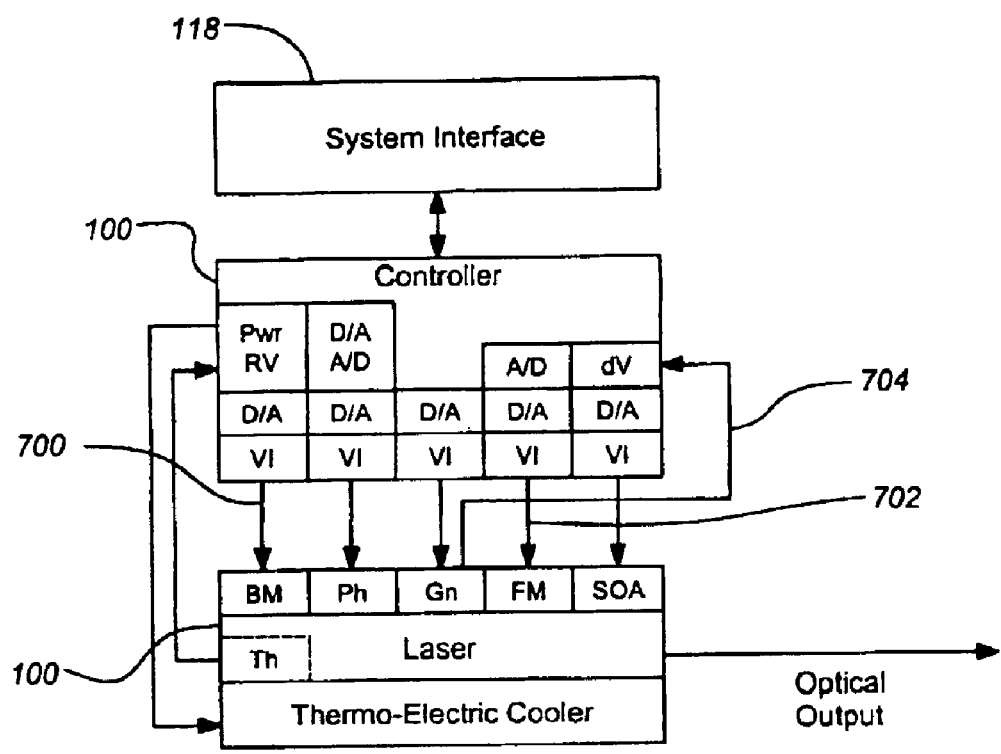
FIG. 7 is a block diagram of a DSP gain voltage control method for use in accordance with the present invention.

A digital signal processor (alternatively referred to as a "DSP") may be used to implement the gain voltage control, as shown in FIG. 7. The DSP dithers the laser mirror currents 700, 702 and monitors the laser gain section voltage 704. It uses a numerical algorithm to align the mirrors by locating the minima of the laser gain section voltage.

7.2 DSP Minima Search Algorithm

An example minima search algorithm can be implemented as follows:

Use three data points (mirror current, gain voltage) and estimate the slope of the gain voltage curve with respect to the mirror current,
Step toward the gain voltage minima and calculate the next data point,
Use the new data point and the two best points to re-estimate the slope of the gain voltage curve,
Continue the above step process, continually searching for the gain voltage minima.

7.3 DSP LMS Estimator

The minima search algorithm may be susceptible to wandering around the gain voltage minima due to noise in the sampled gain voltage signal. The wandering is reflected as drift and noise on the optical signal. The LMS estimator reduces the wander and noise by using an array of data points to estimate the gain voltage surface, in effect, filtering the noise. The LMS estimator converges to the gain voltage minima faster and smoother than the minima search.

For fixed phase and gain section currents, the gain section voltage can be modeled using a causal Volterra series expansion over 2 input signals, the front mirror and back mirror currents. For dithering signals in the sub-100 kHz regime, the analog circuitry and the device itself allow a memoryless model, so a 5-tap adaptive quadratic filter model will suffice.

The LMS estimator can then be achieved using either of two classic adaptive filter update algorithms: a standard gradient descent adaptation (LMS or block LMS algorithm) or a recursive least squares adaptation (RLS algorithm—based on Newton's Method).

The RLS algorithm approach is used to achieve faster convergence of adaptive linear filters when the signals driving the system do not have sufficient spectral flatness to allow a rapid gradient descent However, in the case of adaptive linear filters, the gradient descent approach converges just as fast as the RLS approach when white noise can be used to drive the system. Recently published results indicate that comparable rates of convergence can be achieved with adaptive quadratic filters if a minor filter structure modification is used and (pseudo) Gaussian white noise can be used to drive the system.

There are two advantages of this LMS estimator approach. First, an initial tapvector can be stored along with the four drive currents in the laser calibration table in flash memory (resulting in much faster convergence). Second, the adaptation step size can be reduced as the system converges, reducing steady-state misadjustment in the mirror section currents.

Because of the aforementioned gain spectrum effects, the optimum setpoints for the mirror currents are actually offset from the gain voltage minimum. Therefore, the objective is not to converge to the minimum, but to use an LMS estimator to sense where the minimum would be based on the measured gain voltage surface in the vicinity of the operating point. The control system adjusts the mirror currents to operate at a calibrated current offset from the estimate of the minimum.

7.4 Exemplary LMS Estimator

An exemplary LMS estimator can use five independent data points to determine the surface. The LMS algorithm:

Dithers the mirror currents in a linearly independent fashion about the operating point where,
  a point lies in each quadrant; and
  the step size is less than the power and wavelength accuracy;
Collects the gain and phase current at the mirror current when the power and wavelength are within control tolerance;
Runs the LMS estimator over the data set (at least five independent points);
Resets the mirror operating point to the distance from the inflection points on the surface.

The LMS algorithm continually operates in the background and the five-parameter fit to the quadratic control surface is:

$$r \cdot \left(f + \frac{s}{2r}\right)^2 + n \cdot \left(b + \frac{m}{2n}\right)^2 + c - \frac{s^2}{4 \cdot r} - \frac{m^2}{4 \cdot n} \text{ simplify} \rightarrow$$
$$r \cdot f^2 + s \cdot f + n \cdot b^2 + m \cdot b + c$$

The parameters r and n define the surface curvature for the front and back mirror currents respectively. The parameters s and m define the offset of the surface extremum. The parameter c defines the offset of the surface. The independent variables f and b are the front mirror current and the back mirror current The result maps the quadratic surface of the gain current or phase current. The extremums are at:

$$f = -\frac{s}{2r} \quad b = -\frac{m}{2n}$$

The LMS estimator that generates the surface parameters is:

$$\begin{pmatrix} r \\ s \\ n \\ m \\ c \end{pmatrix} = \begin{pmatrix} Sffff & Sfff & Sffbb & Sffb & Sff \\ Sfff & Sff & Sfbb & Sfb & Sf \\ Sffbb & Sfbb & Sbbbb & Sbbb & Sbb \\ Sffb & Sfb & Sbbb & Sbb & Sb \\ Sff & Sf & Sbb & Sb & N \end{pmatrix}^{-1} \cdot \begin{pmatrix} Szff \\ Szf \\ Szbb \\ Szb \\ Sz \end{pmatrix}$$

where S denotes a summation over the data points of the terms multiplied together and z is the current of the surface. The distance is the df and db from the extremums.

The above technique is preferably used with the gain voltage surface. Furthermore, since in the wavelength-locked case there is a significant cross term (f * b) in the gain voltage surface, a much simpler fit can be performed independently on the front and back mirror dither using three fitting parameters, and the resulting extremum is calculated.

7.5 Analog Gain Voltage Control

The digital algorithms implemented in the DSP are limited in speed and accuracy by the analog to digital converter (ADC) and digital to analog converter (DAC) as well as the signal to noise ratio (SNR) of the circuit.

Figure 8:
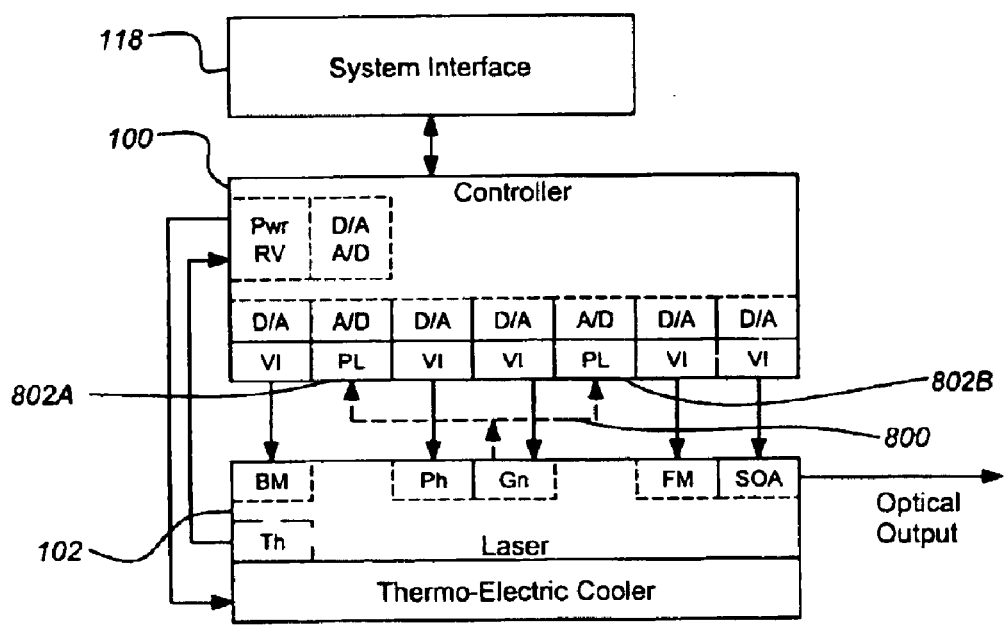
FIG. 8 is a block diagram of an analog gain voltage control method in accordance with the present invention.

An analog gain voltage control is set out in FIG. 8. The analog phase locker's speed and accuracy is limited substantially only by the SNR of the circuit. The analog phase locker (PL) is a high speed, analog-locking loop. It can be realized by a phase lock loop (PPL) or RF dither locker. The PL works with the open loop control circuit. The output of the PL adds to the output of the open loop control current sources. For example, the gain voltage 800 can be applied to separate PL circuits 802A, 802B of the controller 100.

Figure 9:
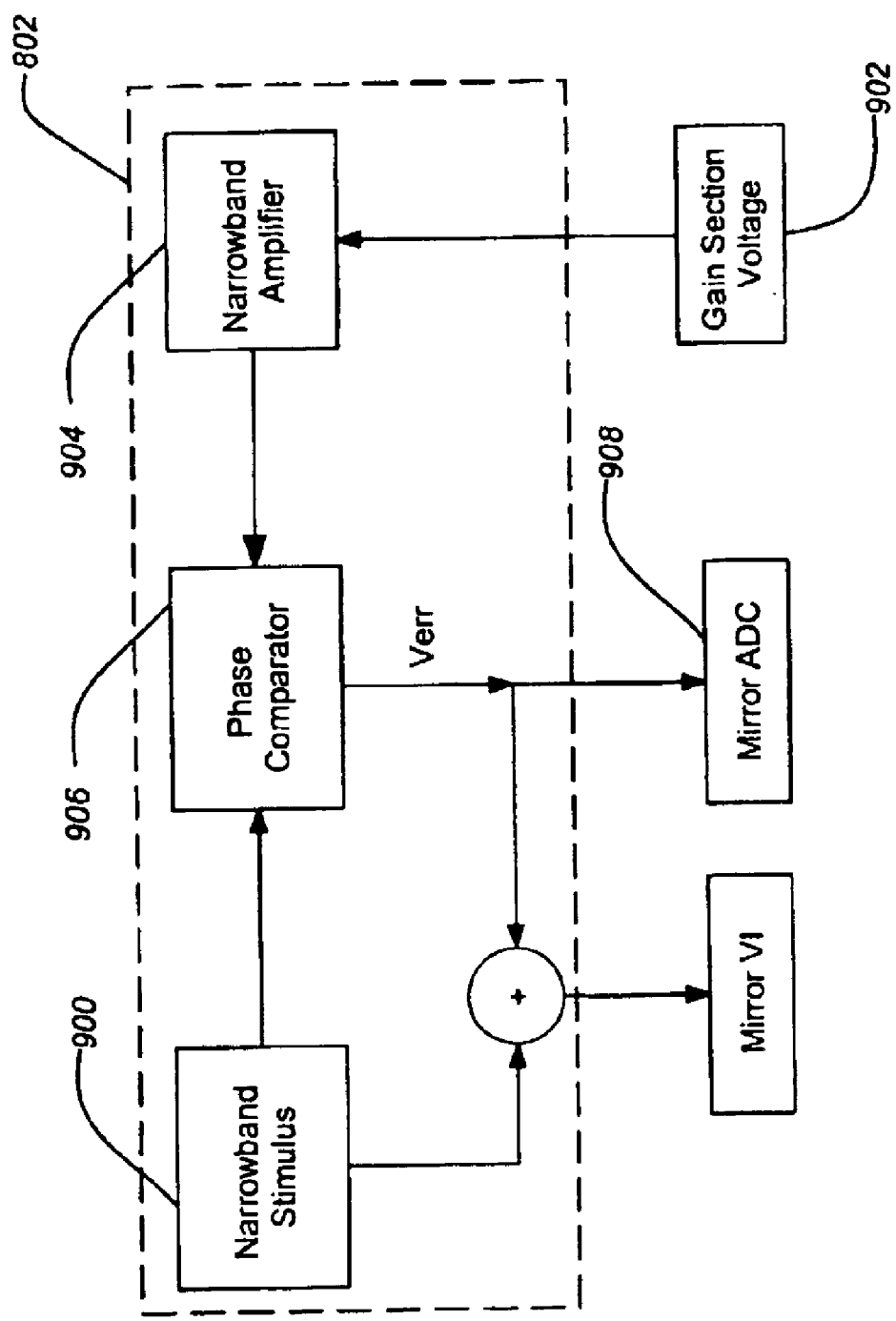
FIG. 9 is an analog phase lock circuit block diagram in accordance with the present invention.

As shown in FIG. 9, an exemplary PL 802 uses a high frequency narrowband stimulus 900 to dither the mirror current The PL 802 measures the gain voltage ($V_g$) 902 with a tuned, narrowband amplifier 904 and extracts the phase difference between stimulus and measured signal with a phase comparator 906. The PL 802 also drives an error amplifier that adjusts the mirror current to the gain voltage minima and is sampled by an ADC 908.

The PL error amplifier output is measured by the DSP. The DSP adjusts the mirror current values in the open loop control lookup table to reduce the error to zero. The DSP effectively operates as an integrator function.

FIG. 13 illustrates the combined operation of analog gain voltage control circuits to correct the outputs to the two mirrors from the open loop digital controller. The digital memory/DSP 1000 can set a first approximation current and voltage from a lookup table. The analog correction circuits 802A, 802B can provide feedback and correction signals to the device as described previously, and the digital controller then monitors the correction signals 1002, 1004 and readjusts the currents and voltages to have the feedback currents from the analog correction portions approach zero. This allows for correction of the laser controller over the life of the SGDBR laser, and accounts for changes in operating temperatures and conditions as well as changes in the operation of the SGDBR laser internal components.

Figure 10:
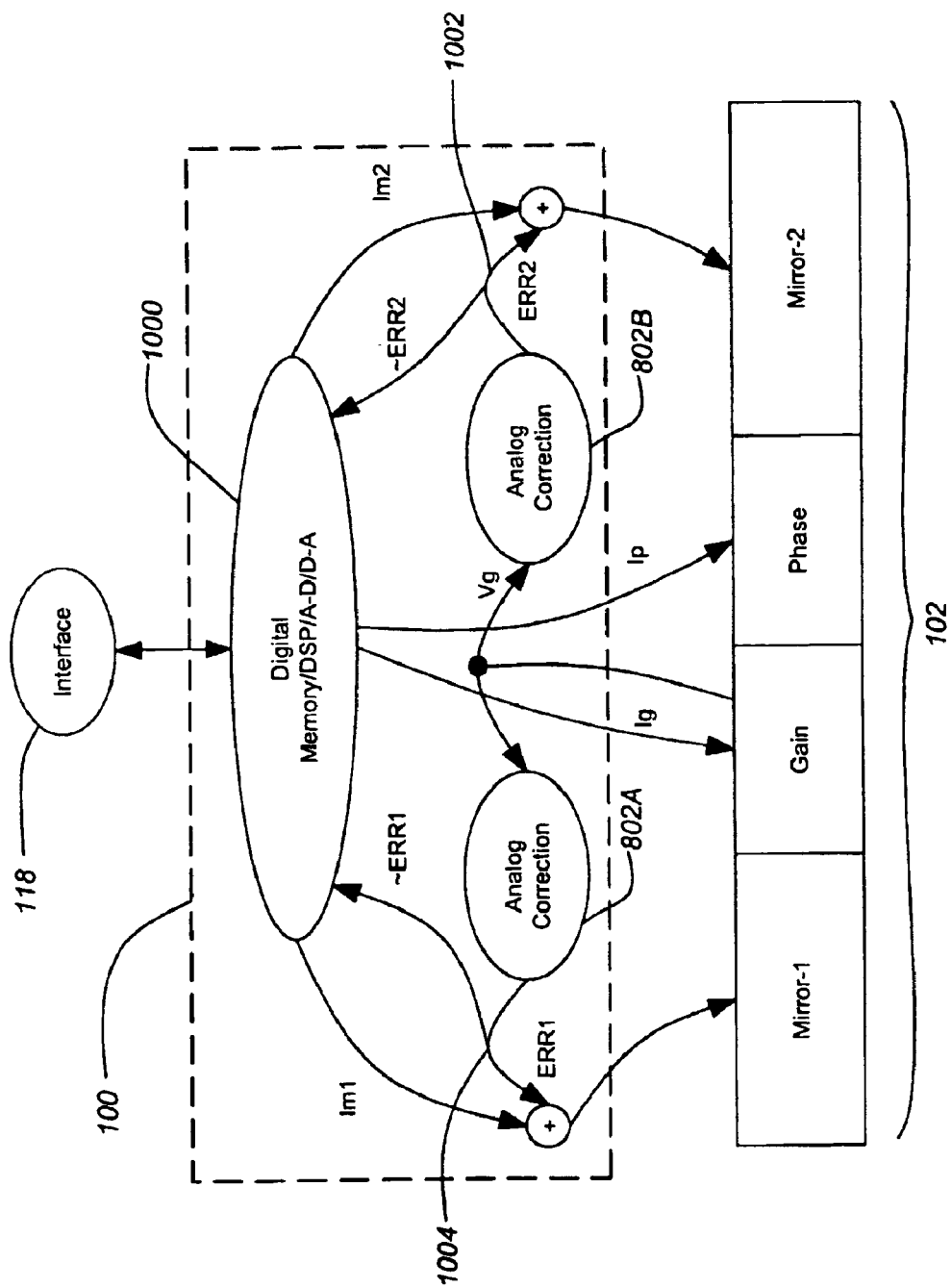
FIG. 10 is a block diagram of a gain and phase current control method in accordance with the present invention.

Gain and phase current control, such as that shown in FIG. 10, uses the extremum point (the maximum or minimum value of a function) of the gain voltage surface (as proxy for the gain and phase current surfaces) to keep the mirrors aligned with the cavity mode. It aligns the mirrors by operating the mirror currents at a substantially fixed distance from the control surface extremums. The distance and extremums are determined during calibration. The mirror operating point corresponds to best-cost function that maximizes the optical power output, wavelength and power stability, and side mode suppression ratio. Gain and phase current control operates in conjunction with power and wavelength control.

Gain and phase current control can be implemented in the DSP using a least mean squares (LMS) quadratic surface estimator, such as that previously described. The DSP dithers the laser mirror currents while operating under power and wavelength control and records the gain and phase currents when the control loops are within tolerance. It can estimate a fit to the gain voltage surface as a function of the front and back mirror currents. Alternately, it can estimate a five-parameter fit to the quadratic control surface for the gain current and the phase current as a function of the front and back mirror currents. It sets the mirror currents at a distance from the surface extremums.

The power, wavelength, and gain voltage controller 100 operates the power and wavelength control and gain voltage control simultaneously.

8.0 Conclusion

The foregoing description of the preferred embodiment of the invention has been presented for the purposes of illustration and description. It is not intended to be exhaustive or to limit the invention to the precise form disclosed. Many modifications and variations are possible in light of the above teaching. It is not intended that the scope of the invention be limited by this detailed description.

This concludes the description of the preferred embodiment of the present invention. The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A digital controller for a sampled grating distributed Bragg reflector (SGDBR) laser, comprising:
   a memory storing a table of settings representing a control surface, each setting corresponding to a separate operating point of the SGDBR laser;
   a first mirror current controller;
   a second mirror current controller;
   a power controller; and
   a wavelength controller;
   wherein the first mirror current controller and the second mirror current controller respectively control a first mirror current and a second mirror current about an estimated extremum point of the control surface to substantially maintain alignment between each of a first mirror and a second mirror, and an associated cavity mode; and
   wherein the power controller adjusts a current to an integrated semiconductor optical amplifier (SOA), and the wavelength controller adjusts a current to a phase section, with error currents derived from signals from an external locker.

2. The digital controller of claim 1, wherein each operating point comprises a first mirror current value, a second mirror current value, a phase current value, an SOA current value and a gain current value.

3. The digital controller of claim 1, wherein the control surface is a gain voltage surface, a gain current surface, or a phase current surface.

4. The digital controller of claim 1, wherein the extremum is estimated using a least mean squares estimator.

5. The digital controller of claim 1, wherein the first mirror current and the second mirror current are locked at a substantially fixed distance from the extremum of the control surface.

6. The digital controller of claim 1, wherein the first mirror current and the second mirror current are dithered while operating under the power controller and the wavelength controller, and wherein a gain current and a phase current are recorded when the power and wavelength controllers are within a tolerance.

7. The digital controller of claim 1, wherein the first mirror current and the second mirror current are dithered while operating under the power controller and the wavelength controller, and wherein a gain voltage is recorded when the power and wavelength controllers are within a tolerance.

8. The digital controller of claim 1, wherein a first fit and a second fit to the control surface are estimated as a function of the first mirror current and the second mirror current, respectively.

9. The digital controller of claim 1, wherein the control surface comprises a quadratic control surface and a five-parameter fit to the control surface is estimated as a function of the first mirror current and the second mirror current.

10. A method of controlling a sampled grating distributed Bragg reflector (SGDBR) laser using a digital controller, comprising:
    storing a table of settings representing a control surface in a memory, each setting corresponding to a separate operating point of the SGDBR laser;
    controlling a first mirror current based on the control surface;
    controlling a second mirror current based on the control surface;
    adjusting a current to an integrated semiconductor optical amplifier (SOA) using a power controller;
    adjusting a current to a phase section using a wavelength controller; and
    generating a laser output of the SGDBR laser;
    wherein the first mirror current and the second mirror current are respectively controlled about an estimated extremum point of the control surface to substantially maintain alignment between each of a first mirror and a second mirror, and an associated cavity mode to produce the laser output; and
    wherein the power controller adjusts the current to the integrated semiconductor optical amplifier (SOA), and the wavelength controller adjusts the current to the phase section, with error currents derived from signals from an external locker.

11. The method of claim 10, wherein each operating point comprises a first mirror current value, a second mirror current value, a phase current value, an SOA current value and a gain current value.

12. The method of claim 10, wherein the control surface is a gain voltage surface, a gain current surface, or a phase current surface.

13. The method of claim 10, wherein the extremum is estimated using a least mean squares estimator.

14. The method of claim 10, wherein the first mirror current and the second mirror current are locked at a substantially fixed distance from the extremum of the control surface.

15. The method of claim 10, the first mirror current and the second mirror current are dithered while operating under the power controller and wavelength controller, and wherein a gain current and a phase current are recorded when the power and wavelength controllers are within a tolerance.

16. The method of claim 10, wherein the first mirror current and the second mirror current are dithered while operating under the power controller and wavelength controller, and wherein a gain voltage is recorded when the power and wavelength controllers are within a tolerance.

17. The method of claim 10, further comprising estimating a first and a second fit to the control surface as a function of the first mirror current and the second mirror current, respectively.

18. The method of claim 10, wherein the control surface comprises a quadratic control surface and further comprising estimating a five-parameter fit to the control surface as a function of the first mirror current and the second mirror current.

* * * * *